(12) United States Patent
Tsai

(10) Patent No.: US 6,900,530 B1
(45) Date of Patent: May 31, 2005

(54) STACKED IC

(75) Inventor: Cheng-Hsun Tsai, Taipei (TW)

(73) Assignee: RamTek Technology, Inc. (TW)

( * ) Notice: Subject to any disclaimer, the term of this patent is extended or adjusted under 35 U.S.C. 154(b) by 0 days.

(21) Appl. No.: 10/747,641

(22) Filed: Dec. 29, 2003

(51) Int. Cl.[7] .......................... H01L 23/02; H01L 23/52
(52) U.S. Cl. ...................... 257/686; 257/686; 257/696; 257/777; 257/784
(58) Field of Search ............................... 257/686, 696, 257/777, 784

(56) References Cited

U.S. PATENT DOCUMENTS 5,804,874 A * 9/1998 An et al. ..................... 257/676
6,572,387 B2 * 6/2003 Burns et al. .................. 439/69

* cited by examiner

Primary Examiner—Allan R. Wilson
Assistant Examiner—Joseph Nguyen
(74) Attorney, Agent, or Firm—Madson & Metcalf

(57) ABSTRACT

A stacked IC includes a first IC package unit, a second IC package unit and an interface layer. The first IC package unit includes an IC chip, an encapsulant resin and a plurality of lead wires. The IC chip is encapsulated by the encapsulant resin. Each of the lead wires includes a first end connected to the IC chip and encapsulated by the encapsulant resin, a second end extending outside the encapsulant resin, and a bend portion arranged between the first end and the second end and having at least one surface exposed outside of the encapsulant resin. The second IC package unit has the same structure as the first IC package unit. The interface layer is sandwiched between the first IC package unit and the second IC package unit, and has a first side connected to the bend portion of the first IC package unit and a second side connected to the second end of the second IC package unit.

8 Claims, 7 Drawing Sheets

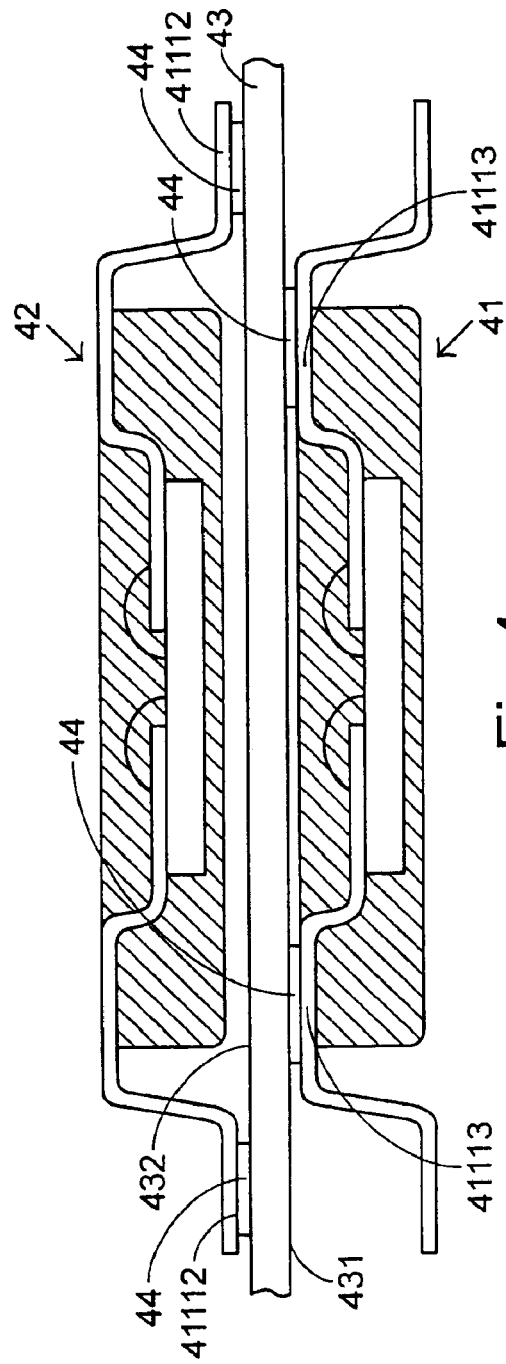
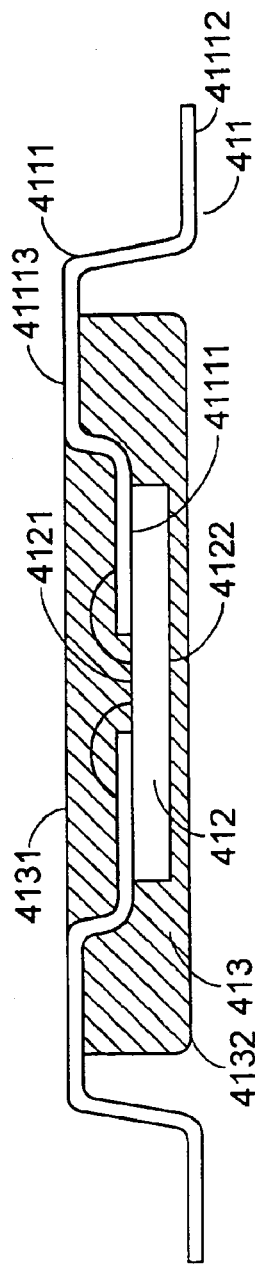

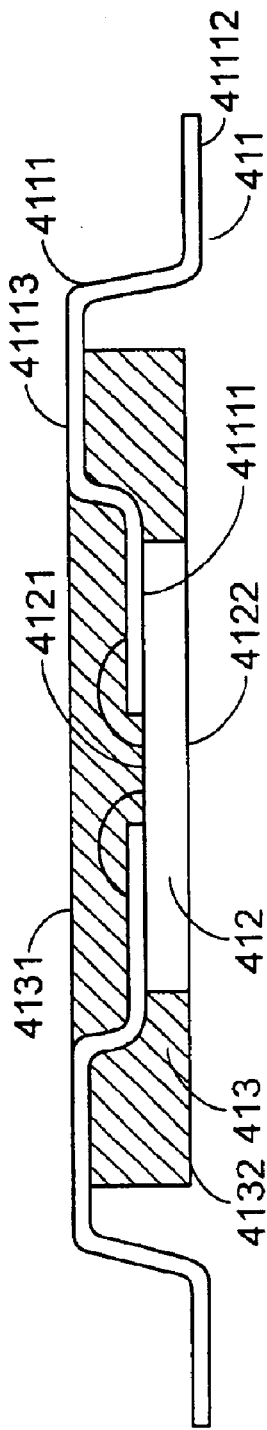
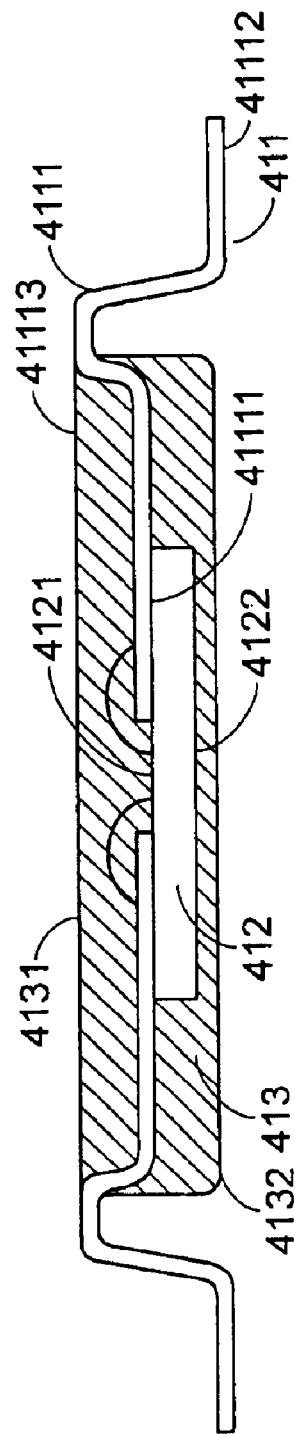
Fig.7
Fig.8

STACKED IC

FIELD OF THE INVENTION

The present invention relates to a stacked IC, and more particularly to a stacked IC with a plurality of package units in a stack form.

BACKGROUND OF THE INVENTION

With the rapid progress of semiconductor industries, the integrated circuits (ICs) used in electronic devices are developed toward minimization. high operating speed and increasing integration level. In a computer system or similar electronic products, CPU determines system performance, and the capacity and the operating speeds of the memory chips are important factors that affect data processing efficiency. Take a memory chip for example. Nowadays, for complying with a requirement of miniaturization, the memory chip is designed to have a high storage capacity with a reduced size. For a purpose of reducing cost and size, a so-called stacking method is widely used to interconnect multiple memory chips in a stack form so as to form a memory module, i.e. a stacked IC.

Referring to FIG. 1, a conventional stacked IC is shown. The stacked IC I comprises a first IC package unit 11 and a second IC package unit 12 in a stack form. The first IC package unit 11 and the second IC package unit 12 are provided on the bottom and the top of the stacked IC, respectively. Each of the IC package units 11 and 12 comprises an IC chip, a lead frame and a plurality of lead wires. In order to make electrical connection between these two IC package units 11 and 12, the lead wires 112 of the second IC package unit 12 should be bent inward to be in contact with the lead wires 111 of the first IC package unit 11 and then soldered thereon. Although the manner for fabricating this stacked IC 1 is cost effective, the internal structure of the second IC package unit 12 may be damaged during the operation of bending the lead wires 112. In addition, such manner is time-consuming.

Referring to FIG. 2, another conventional stacked IC is shown. The stacked IC 2 comprises a first IC package unit 21, a second IC package unit 22 and an interface layer 23 sandwiched between the IC package units 21 and 22. Each of the IC package units 21 and 22 comprises an IC chip, a lead frame and a plurality of lead wires. The interface layer 23 having a plurality of bent pins 231 extending from the bilateral edges thereof. In order to make electrical connection between these two IC package units 21 and 22, the lead wires 212 of the second IC package unit 22 is firstly soldered onto the interface layer 23. The bent pins 231 of the interface layer 23 are then soldered onto the lead wires 211 of the first IC package unit 21 so as to form the stacked IC 2. The manner for fabricating this stacked IC 2 is more complicated because the pins 231 of the interface layer 23 need to be bent in advance and the soldering procedure should be done manually.

Referring to FIG. 3, another conventional stacked IC is shown. The stacked IC 3 comprises a first IC package unit 31 and a second package unit 32. Each of the IC package units 31 and 32 comprises a chip, a lead frame and a plurality of lead wires. Each terminal of the lead wires 311 and 322 for the respective IC package units 31 and 32 is connected to a conductor 33, 34. The connection of the conductors 33 and 34 performs the electrical connection between these two IC package units 31 and 32. The manner for fabricating this stacked IC 3 uses no interface layer. However, this manner is more time-consuming and costly because two stages are required to make electrical connection, i.e. (1) the conductors should be coupled to the terminals of the lead wires, and (2) these conductors are further connected with each other.

SUMMARY OF THE INVENTION

It is an object of the present invention to provide a stacked IC with a plurality of package units in a stack form, in which the stacked IC is easily packaged and cost-effective.

In accordance with a first aspect of the present invention, there is provided a stacked IC. The stacked IC comprises a first IC package unit, a second IC package unit and an interface layer. The first IC package unit comprises an IC chip, an encapsulant resin and a plurality of lead wires. The IC chip is encapsulated by the encapsulant resin. Each of the lead wires comprises a first end connected to the IC chip and encapsulated by the encapsulant resin, a second end extending outside the encapsulant resin, and a bend portion arranged between the first end and the second end and having at least one surface exposed outside of the encapsulant resin. The second IC package unit has the same structure as the first IC package unit. The interface layer is sandwiched between the first IC package unit and the second IC package unit, and has a first side connected to the bend portion of the first IC package unit and a second side connected to the second end of the second IC package unit, thereby achieving electrical connection between the first IC package unit and the second IC package unit.

In an embodiment, the bend portion has a top surface exposed outside of the encapsulant resin, and the remainder thereof is encapsulated by the encapsulant resin.

In an embodiment, the bend portion is exposed outside and extended from the encapsulant resin.

In an embodiment, the first side of the interface layer has a plurality of first solder pads connected to the first lead wires of the first IC package unit.

In an embodiment, the second side of the interface layer has a plurality of second solder pads connected to the second ends of the lead wires of the second IC package unit.

In an embodiment, the IC chip for each of the first IC package unit and the second IC package unit has a bottom surface uncovered by the encapsulant resin.

In an embodiment, the interface layer is made of a hard dielectric material.

In an embodiment, the interface layer is made of a soft dielectric material.

In an embodiment, the IC chip for each of the first IC package unit and the second IC package unit is selected from a group consisting of a memory chip, an application specific integrated circuit (ASIC) chip and a driving integrated circuit chip.

In accordance with a second aspect of the present invention, there is provided a stacked IC. The stacked IC comprises a first IC package unit, a second IC package unit and an interface layer. The first IC package unit comprises a first IC chip, a first encapsulant resin and a plurality of first lead wires. The first IC chip is encapsulated by the first encapsulant resin. Each of the first lead wires comprises a first end connected to the first IC chip and encapsulated by the first encapsulant resin, a second end extending outside the first encapsulant resin, and a bend portion arranged between the first end and the second end and having at least one surface exposed outside of the first encapsulant resin. The second IC package unit comprises a second IC chip, a second encapsulant resin and a plurality of second lead wires. The second IC chip is encapsulated by the second encapsulant resin. Each of the second lead wires comprises a third end connected to the second IC chip and encapsulated by the second encapsulant resin, and a fourth end extending outside the second encapsulant resin. The interface layer is sandwiched between the first IC package unit and the second IC package unit, and has a first side connected to the bend portion of the first IC package unit and a second side connected to the fourth end of the second IC package unit, thereby achieving electrical connection between the first IC package unit and the second IC package unit.

In accordance with a third aspect of the present invention, there is provided a stacked IC. The stacked IC comprises an IC package unit, a ball grid array (BGA) package unit and an interface layer. The first IC package unit comprises a first IC chip, a first encapsulant resin and a plurality of first lead wires. The first IC chip is encapsulated by the first encapsulant resin. Each of the first lead wires comprises a first end connected to the first IC chip and encapsulated by the first encapsulant resin, a second end extending outside the first encapsulant resin, and a bend portion arranged between the first end and the second end and having at least one surface exposed outside of the first encapsulant resin. The BGA package unit comprises a plurality of solder balls. The interface layer is sandwiched between the IC package unit and the BGA package unit, and has a first side connected to the bend portion of the IC package unit and a second side connected to the solder balls of the BGA package unit, thereby achieving electrical connection between the IC package unit and the BGA package unit.

In accordance with a fourth aspect of the present invention, there is provided an IC module comprising a circuit board and a plurality of stacked ICs as described above. The stacked ICs are arranged on the top surface and the bottom surface of the circuit board.

The above objects and advantages of the present invention will become more readily apparent to those ordinarily skilled in the art after reviewing the following detailed description and accompanying drawings, in which:

DESCRIPTION OF THE DRAWINGS

FIG. 4 is a schematic view illustrating a stacked IC packaged in a stack form according to a first embodiment of the present invention;

FIG. 5 is a schematic view illustrating respective IC package unit of FIG. 4;

FIG. 7 is a schematic view illustrating an IC package unit according to a second embodiment of the present invention;

FIG. 8 is a schematic view illustrating an IC package unit according to a third embodiment of the present invention;

DETAILED DESCRIPTION OF THE PREFERRED EMBODIMENT

Referring to FIG. 4, a schematic view of a stacked IC according to a first embodiment of the present invention is shown. The stacked IC comprises a first IC package unit 41, a second IC package unit 42 and an interface layer 43. The first IC package unit 41 and the second IC package unit 42 have the same structure and are provided on the bottom and the top of the stacked IC, respectively. The interface layer 43 is sandwiched between the first IC package unit 41 and the second IC package unit 42. Through the interface layer 43, the first IC package unit 41 and the second IC package unit 42 are electrically connected with each other.

Figure 6:
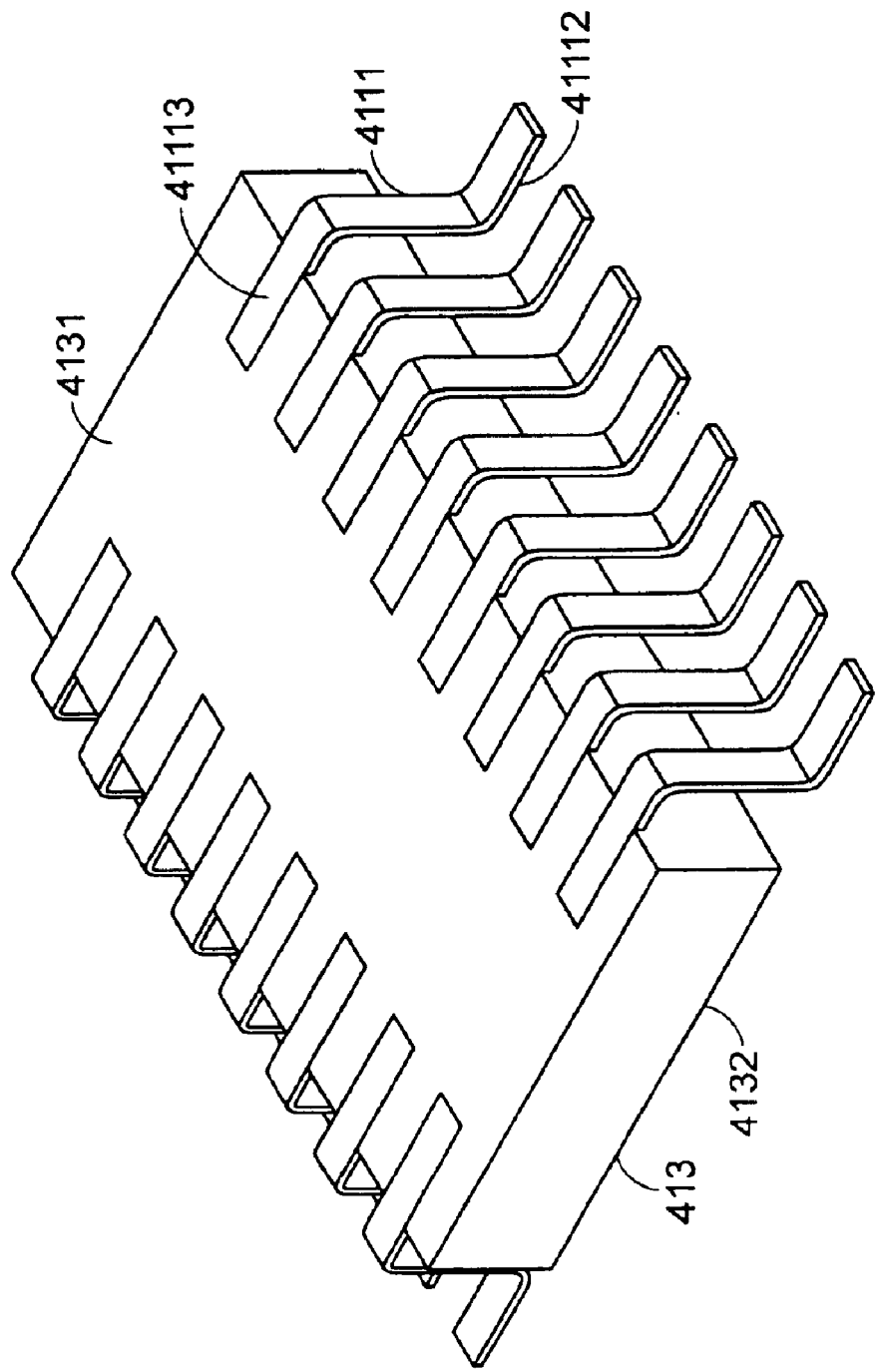
FIG. 6 is a perspective view illustrating the IC package unit of FIG. 5.

Please refer to FIG. 5. Take the first IC package unit 41 for example. The first IC package unit 41 comprises a lead frame 411, an IC chip 412 and an encapsulant resin 413. The IC chip 412 has a first surface 4121 and a second surface opposite to each other. The first surface 4121 of the IC chip 412 has thereon a plurality of electrical pads (not shown). The lead frame 411 has a plurality of lead wires 4111. Each lead wire 4111 has a first end 41111 and a second end 41112. The first end 41111 is electrically connected to the corresponding electrical pad on the first surface 4121 of the IC chip 412. The second end 41112 is exposed outside the encapsulant resin 413. In this embodiment, every two second ends 41112 are arranged at both sides of the IC chip 412, as can also be seen be referring to FIG. 6. Furthermore, after the IC chip 412 is encapsulated with the encapsulant resin 413, a top surface 4131 and a bottom surface 4122 of the IC package unit 41 are formed. The encapsulant resin 413 of the embodiment is substantially in a rectangular form, and the second ends 41112 of the lead wire 4111 are uniformly distributed at both sides of the encapsulant resin 413 along the longitudinal direction. The lead wire 4111 also has a bend portion 41113 arranged between the first end 41111 and the second end 41112. Since the bend portion 41113 has a top side uncovered by the encapsulant resin 413, the bend portion 41113 can be used as a soldering portion for performing solder bonding operation.

Please refer to FIG. 4 again. The interface layer 43 has a first surface 431 and a second surface 432 connected to the first IC package unit 41 and the second IC package unit 42, respectively. The first surface 431 and the second surface 432 of the interface layer 43 have a plurality of solder pads (not shown). After the bend portion 41113 of the first IC package unit 41 is soldered with a soldering material 44, the first IC package unit 41 will be bonded to the interface layer 43. Likewise, after the second end 41112 of the second IC package unit 42 is soldered with the soldering material 44, the second IC package unit 42 will be bonded to the interface layer 43. The soldering material 44 used in this embodiment can be a solder paste, and the interface layer 43 can be made of hard or soft dielectric material.

The process for packaging the stacked IC of the present invention will be described in more details with reference to the following example. Firstly, a first IC package unit 41 and a second IC package unit 42, which have structures as that shown in FIG. 4, are provided. Then, by means of a surface mounting technology, the bend portion 41113 of the first IC package unit 41 will be bonded to the solder pads on the bottom of the interface layer 43 after passing through a solder plating machine. Likewise, by means of a surface mounting technology, the second end 41112 of the second IC package unit 42 will be bonded to the solder pads on the top of the interface layer 43 after passing through a solder plating machine. In such way, via the interface layer 43, the IC package units 41 and 42 are electrically connected with each other in a stack form.

Another embedment of the respective IC package unit is shown in FIG. 7. The second surface 4122 of the IC chip 412 is not covered by the encapsulant resin 413 so as to reduce the height of the respective IC package unit and minimize use of the encapsulant resin 413. Therefore, the stacked IC packaged with such IC package units has a reduced volume.

Moreover, the bend portion 41113 can be fully extended from the encapsulant resin 413, as shown in FIG. 8 so as to enhance the adhesion between the lead wire 4111 and the encapsulant resin 413.

Figure 9:
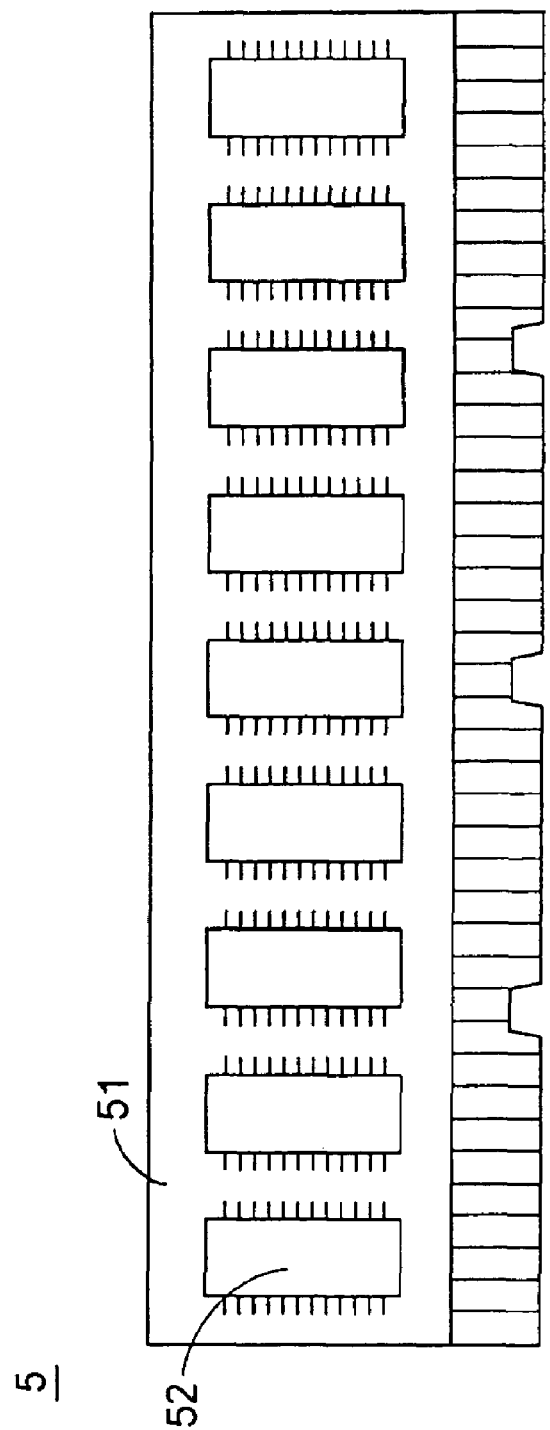
FIG. 9 is a schematic view illustrating an IC module with a plurality of stacked ICs.

Referring to FIG. 9, an IC module 5 comprising a circuit board 51 and a plurality of stacked ICs 52 is shown. The stacked ICs 52 are arranged on the top and the bottom surfaces of the circuit board 51. The structure of respective stacked IC 52 is similar to that of FIG. 4, which is not intended to be described redundantly herein.

Figure 1:
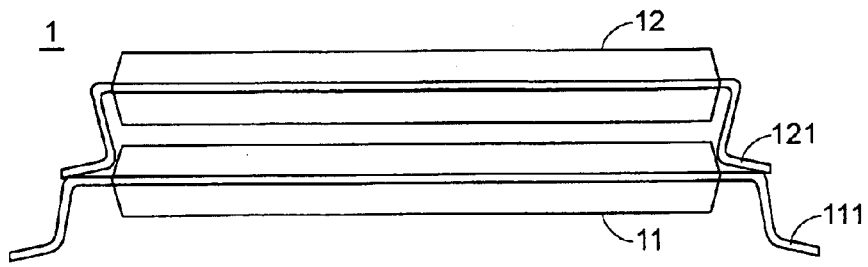
FIG. 1 is a schematic view illustrating a conventional stacked IC packaged in a stack form.
Figure 2:
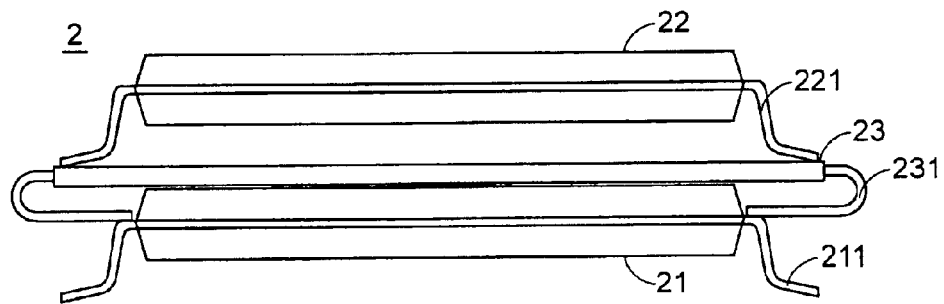
FIG. 2 is a schematic view illustrating another conventional stacked IC packaged in a stack form.
Figure 3:
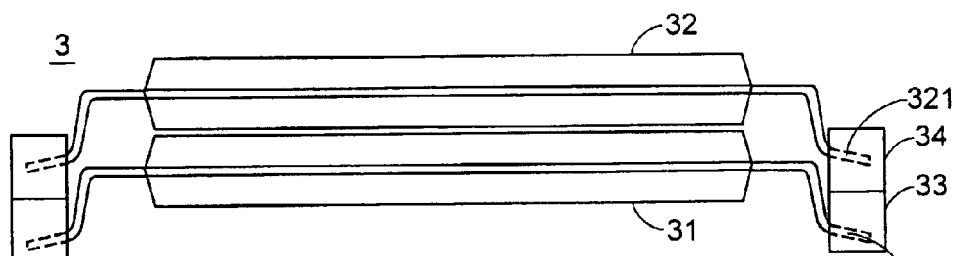
FIG. 3 is a schematic view illustrating another conventional stacked IC packaged in a stack form.

From the above description, the stacked IC of the present invention can be automatically fabricated by bonding the lead wires of the first IC package unit and the second IC package unit onto the interface layer. In addition, for enhancing convenience, the locations of the solder pads on the interface layer can be predetermined according to a similar method of fabricating circuit boards. Compared to the case shown in FIG. 1, the terminals of the lead wires of the IC package units need not to be bent in advance. Compared to two-stage method and the method using two conductors shown in FIGS. 2 and 3, the stacked IC of the present invention uses less number of components. Therefore, the process for fabricating the stacked IC of the present invention is more cost-effective, simpler and has lower volume and higher capacity when compared with the prior art.

Figure 10:
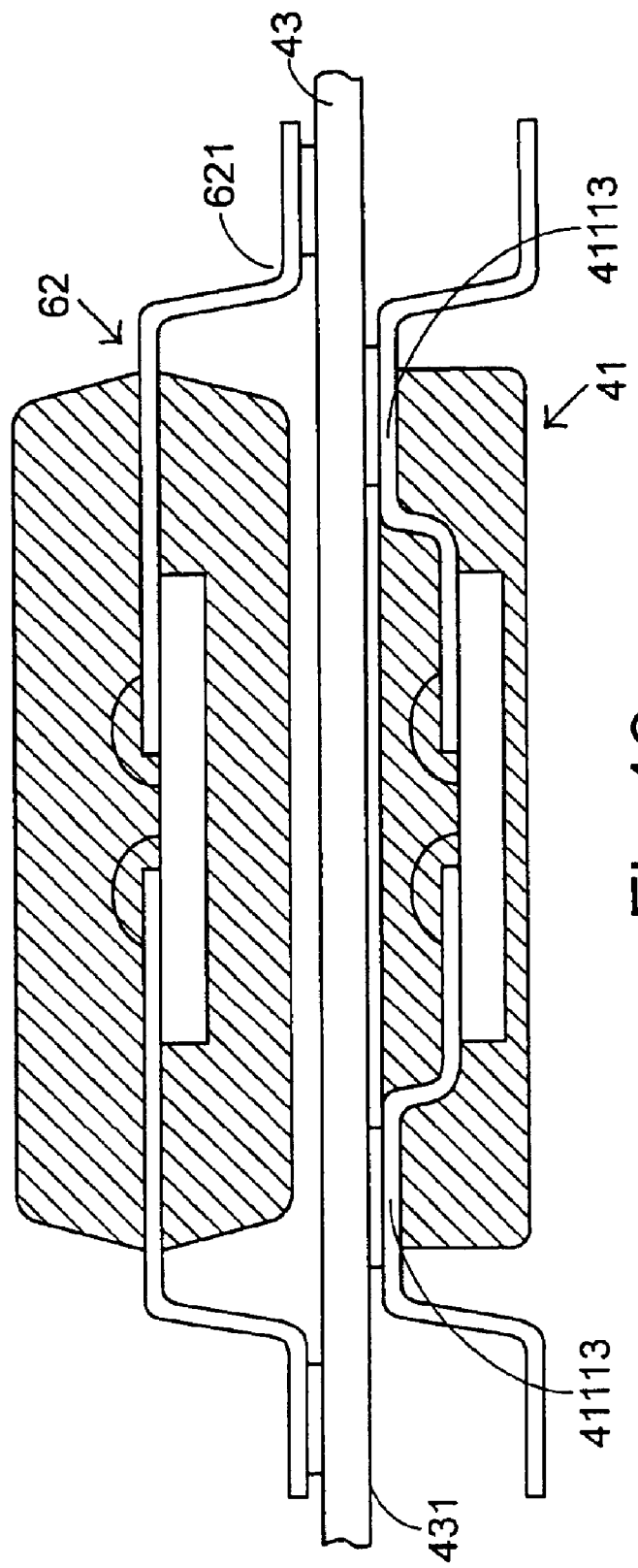
FIG. 10 is a schematic view illustrating an IC package unit according to a fourth embodiment of the present invention.

Referring to FIG. 10, a schematic view of a stacked IC according to a fourth embodiment of the present invention is shown. This stacked IC is similar to that of FIG. 4, except that the second IC package unit 42 arranged on the top is replaced by a thin small out-line package (TSOP) unit 62. The lead wire 621 of the TSOP unit 62 is bonded to the solder pads on the top of the interface layer 43 so as to make electrical connection of the first IC package unit 41 and the TSOP unit 62.

Figure 11:
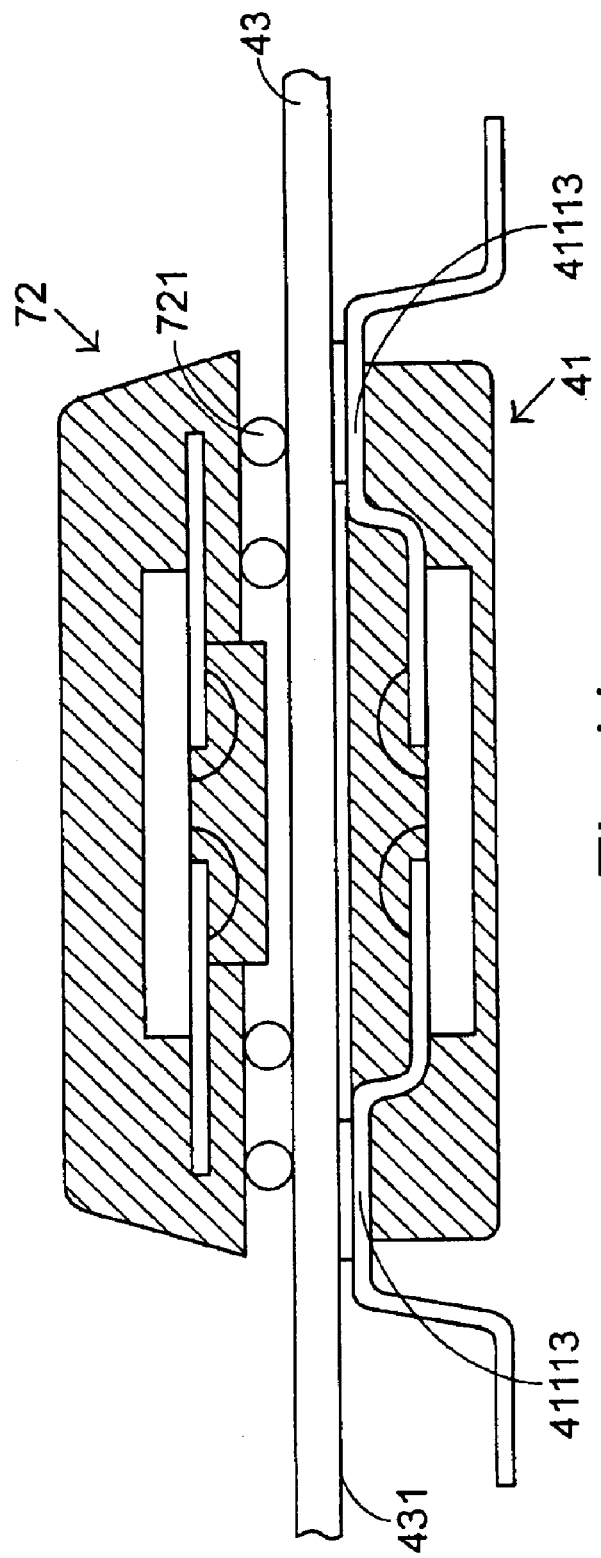
FIG. 11 is a schematic view illustrating an IC package unit according to a fifth embodiment of the present invention.

Likewise, as shown in FIG. 11, the stacked IC is similar to that of FIG. 4, except that the second IC package unit 42 arranged on the top is replaced by a ball grid array (BGA) package unit 72. The solder ball 721 of the BGA package unit 72 is bonded to the solder pads on the top of the interface layer 43 so as to make electrical connection of the first IC package unit 41 and the BGA package unit 72.

The present invention is illustrated by referring to a stacked IC with two stacked memory chips such as DRAM, DDR DRAM, RAMBUS DRAM, FLASH or SRAM. Nevertheless, the present invention can be applied to application specific integrated circuit (ASIC) or the driving integrated circuit of the liquid crystal display device.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A stacked IC comprising:

a first IC package unit comprising an IC chip, an encapsulant resin and a plurality of lead wires, said IC chip being encapsulated by said first encapsulant resin, wherein each of said lead wires comprises a first end connected to said IC chip and encapsulated by said encapsulant resin, a second end extending outside said first encapsulant resin, and a bend portion arranged between said first end and said second end and having at least one surface exposed outside of said encapsulant resin;

a second IC package unit comprising a second IC chip, a second encapsulant resin and a plurality of second lead wires, said second IC chip being encapsulated by said second encapsulant resin, wherein each of said second lead wires comprises a third end connected to said second IC chip and encapsulated by said second encapsulant resin, and a fourth end extending outside said second encapsulant resin; and an interface layer sandwiched between said first IC package unit and said second IC package unit, and having a first side connected to said bend portion of said first IC package unit and a second side connected to said fourth end of said second IC package unit, thereby achieving electrical connection between said first IC package unit and said second IC package unit.

2. The stacked IC according to claim 1 wherein said bend portion of said first lead wire has a top surface exposed outside of said first encapsulant resin, and the remainder thereof is encapsulated by said first encapsulant resin.

3. The stacked IC according to claim 1 wherein said bend portion of said first lead wire is exposed outside and extended from said first encapsulant resin.

4. The stacked IC according to claim 1 wherein said first side of said interface layer has a plurality of first solder pads connected to said bend portions of said first lead wires of said first IC package unit.

5. The stacked IC according to claim 1 wherein said second side of said interface layer has a plurality of second solder pads connected to said fourth ends of said lead wires of said second IC package unit.

6. The stacked IC according to claim 1 wherein said interface layer is made of a hard dielectric material.

7. The stacked IC according to claim 1 wherein said interface layer is made of a soft dielectric material.

8. The stacked IC according to claim 1 wherein each of said first IC chip, and said second IC chip is selected from a group consisting of a memory chip, an application specific integrated circuit (ASIC) chip and a driving integrated circuit chip.

* * * * *